(12) United States Patent
Howard

(10) Patent No.: US 9,558,825 B1
(45) Date of Patent: Jan. 31, 2017

(54) SYSTEM AND METHOD TO DISCOVER AND ENCODE INDIRECT ASSOCIATIONS IN ASSOCIATIVE MEMORY

(71) Applicant: HRL Laboratories, LLC, Malibu, CA (US)

(72) Inventor: Michael D. Howard, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 40 days.

(21) Appl. No.: 14/750,884

(22) Filed: Jun. 25, 2015

Related U.S. Application Data

(60) Provisional application No. 62/016,860, filed on Jun. 25, 2014.

(51) Int. Cl.
*G06F 12/00* (2006.01)
*G11C 15/00* (2006.01)
*G11C 15/04* (2006.01)

(52) U.S. Cl.
CPC .............. *G11C 15/00* (2013.01); *G11C 15/04* (2013.01)

(58) Field of Classification Search
None
See application file for complete search history.

(56) References Cited

U.S. PATENT DOCUMENTS

| | | | | |
|---|---|---|---|---|
| 8,176,242 B1 * | 5/2012 | Shamis | ................ | G11C 15/00 365/49.1 |
| 8,626,688 B2 * | 1/2014 | Ichino | ................ | G06F 17/2765 706/45 |
| 2015/0154317 A1 * | 6/2015 | Inoue | .................... | G10L 15/28 711/108 |
| 2015/0279466 A1 * | 10/2015 | Manning | .............. | G11C 15/043 365/49.17 |

OTHER PUBLICATIONS

Kostas Pagiamtzis and Ali Sheikholeslami, "Content-Addressable Memory (CAM) circuits and Architectures: A Tutorial and Survey," IEEE Journal of Solid-State Circuits, vol. 41, No. 3, p. 712-727, Mar. 2006.

* cited by examiner

*Primary Examiner* — Brian Peugh
(74) *Attorney, Agent, or Firm* — Tope-McKay & Associates

(57) ABSTRACT

Described is a system for detecting and encoding indirect associations in associative memory. The system receives a data storage input in a content-addressable memory (CAM), the data storage input comprising an association between a first data pattern A and a second data pattern B. At least one indirect association related to the data storage input is identified with an inductive logic unit (ILU) interfaced with the CAM, and the indirect association is stored for later recall. A query is generated from the ILU to the CAM to determine whether either of the first data pattern A or the second data pattern B is stored as part of an existing association in the CAM. If either the first data pattern A or the second data pattern B are known, then a new indirect association for the known data pattern is stored.

18 Claims, 5 Drawing Sheets

SYSTEM AND METHOD TO DISCOVER AND ENCODE INDIRECT ASSOCIATIONS IN ASSOCIATIVE MEMORY

GOVERNMENT LICENSE RIGHTS

This invention was made with government support under U.S. Government Contract Number D10PC20021. The government has certain rights in the invention.

CROSS-REFERENCE TO RELATED APPLICATIONS

This is a Non-Provisional Application of U.S. Provisional Patent Application No. 62/016,860, filed Jun. 25, 2014, entitled, "System and Method to Discover and Encode Indirect Associations in Associative Memory," the entirety of which is hereby incorporated by reference as though fully set forth herein.

BACKGROUND OF THE INVENTION (1) Field of Invention

The present invention relates to a system for detecting and encoding indirect associations in stimulus patterns and, more particularly, to a system for detecting and encoding indirect associations in stimulus patterns by performing inductive logic.

(2) Description of Related Art

Content-addressable memory (CAM) is a special type of computer memory used in certain very-high-speed searching applications. CAM compares input search data against a table of stored data, and returns the address of matching data (or in the case of associative memory, the matching data). In "Content-Addressable Memory (CAM) Circuits and Architectures: A Tutorial and Survey," IEEE Journal of Solid-State Circuits, Vol. 41, No. 3, pg. 712-727, March 2006 (hereinafter referred to as the Pagiamtzis reference and incorporated by reference as though fully set forth herein), Pagiamtzis and Sheikholeslami surveyed CAM architectures. However, these architectures do not discover new associations. In current systems, an association between two items (e.g., a new item A is associated with a previously encountered item B) can only be stored in an associative memory when it is encountered, or through a logical process that takes time.

Therefore, a continuing need exists for an associative memory system that has speedier recall and makes indirect associations without needing to directly experience them, thus discovering knowledge.

SUMMARY OF THE INVENTION

The present invention relates to a system for detecting and encoding indirect associations in stimulus patterns and, more particularly, to a system for detecting and encoding indirect associations in stimulus patterns by performing inductive logic. In one aspect, the system comprises a content-addressable memory (CAM) configured to receive at least one data storage input comprising an association between a first data pattern and a second data pattern; and an inductive logic unit (ILU) interfaced with the CAM for identifying at least one indirect association related to the at least one data storage input.

In another aspect, the present invention relates to a system for detecting and encoding indirect associations in stimulus patterns comprising one or more processors and a non-transitory computer-readable medium having executable instructions encoded thereon such that when executed, the one or more processors perform multiple operations. The system receives at least one data storage input in a content-addressable memory (CAM), wherein the at least one data storage input comprises an association between a first data pattern A and a second data pattern B. At least one indirect association related to the at least one data storage input is identified with an inductive logic unit (ILU) interfaced with the CAM, and the at least one indirect association is stored.

In another aspect, the system generates a query from the ILU to the CAM and determines whether either of the first data pattern A or the second data pattern B is stored as part of an existing association in the CAM. If either the first data pattern A or the second data pattern B is a known data pattern, then storing a new indirect association for the known data pattern.

In another aspect, a user inputs a direct query into the CAM to determine if a data pattern is stored as part of an existing association in the CAM, wherein if the data pattern is stored as part of an existing association in the CAM, then a recall in response to the user's direct query is output to the user and copied to the ILU.

In another aspect, storage of the at least one indirect association is contingent on a utility metric passing a predetermined threshold.

In another aspect, an association between the first data pattern A and a previous association X is queried. If a previous association A-X is found in the CAM, then an indirect association B-X is stored. An association between the second data pattern B and the previous association X is queried, and if a previous association B-X is found in the CAM, then an indirect association A-X is stored.

In another aspect, at least one of the first data pattern A and the second data pattern B is a member of a class that includes a third data pattern C, and the at least one indirect association is an association between the third data pattern C with at least one of the first data pattern A and the second data pattern B.

In another aspect, at least one of the first data pattern A and the second data pattern B includes image data acquired using an image sensor.

In another aspect, the present invention also comprises a method for causing a processor to perform the operations described herein.

Finally, in yet another aspect, the present invention also comprises a computer program product comprising computer-readable instructions stored on a non-transitory computer-readable medium that are executable by a computer having a processor for causing the processor to perform the operations described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
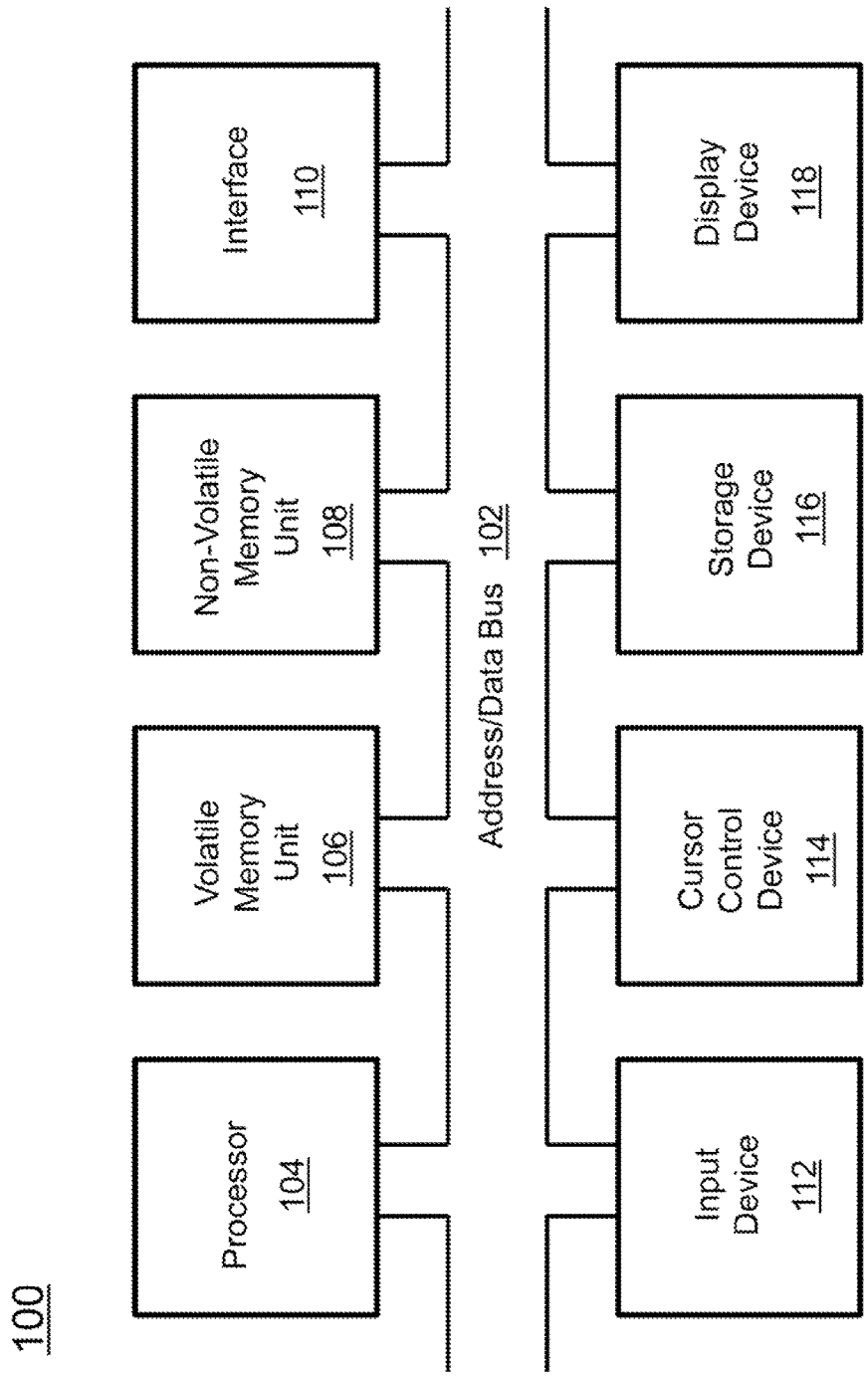
FIG. 1 is a block diagram depicting the components of a system for detecting and encoding indirect associations in stimulus patterns according to the principles of the present invention.

The present invention relates to a system for detecting and encoding indirect associations in stimulus patterns and, more particularly, to a system for detecting and encoding indirect associations in stimulus patterns by performing inductive logic. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object. As such, as the present invention is changed, the above labels may change their orientation.

Before describing the invention in detail, a description of various principal aspects of the present invention is provided. Subsequently, specific details of the present invention are provided to give an understanding of the specific aspects.

(1) Principal Aspects

The present invention has three "principal" aspects. The first is a system for detecting and encoding indirect associations in stimulus patterns. The system is typically in the form of a computer system (e.g., with one or more processors) operating software or in the form of a "hard-coded" instruction set. This system may be incorporated into a wide variety of devices that provide different functionalities, such as a robot or other device. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, or a field programmable gate array.

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
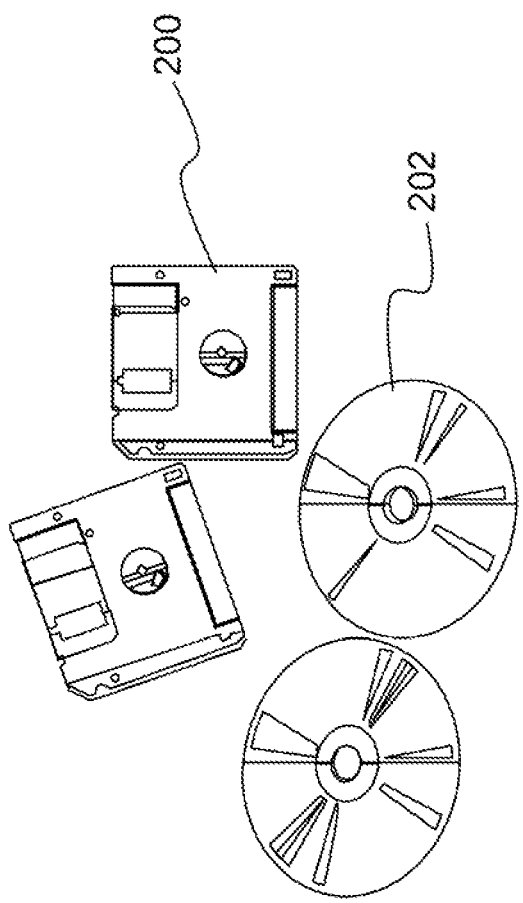
FIG. 2 is an illustration of a computer program product according to the principles of the present invention.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Specific Details of the Invention

In current systems, an association between two items (e.g., a new item A is associated with a previously encountered item B) can only be stored in an associative memory when it is encountered, or through a logical process that takes time. If item B is already associated in the associative memory with items C, D, and E, and one asks if item A is associated with item D, one might cue a recall with A-? and recall A-B, and then cue B-? and get B-C, B-D, and B-E. For instance, as a non-limiting example A is an orange, B is the class fruit, and C, D, and E are previously encountered fruits, such as an apple, a pear, and a banana. Additionally, one can discover the syllogism, A→B, B→D and conclude A→D, where arrows indicate an association. A common example of a syllogism is "dogs are animals, animals have four legs; therefore, dogs have four legs". That logical search and inductive reasoning takes time.

The system according to the principles of the present invention encodes the syllogism when any new pattern is associated with any known pattern at the time that the new pattern is stored. For example, when "orange is a fruit" is stored, then the system automatically cues a recall with fruit-? and finds apple, pear, and banana, then it stores new associative pairs orange-apple, orange-pear, orange-banana. It would also test orange-? and, likewise, make new associative pairs with any matches. This can be done offline, in the background, so as the new induced associations are queried, they can be readily recalled from memory. Therefore, with the addition of an extra logic unit to test each item in a new associative pair to find any previously stored matches and to store the new associations, the system according to the principles of the present invention provides speedier recall at the time when it is needed. More than that, by making indirect associations without needing to directly experience them, the system is discovering knowledge.

Figure 3:
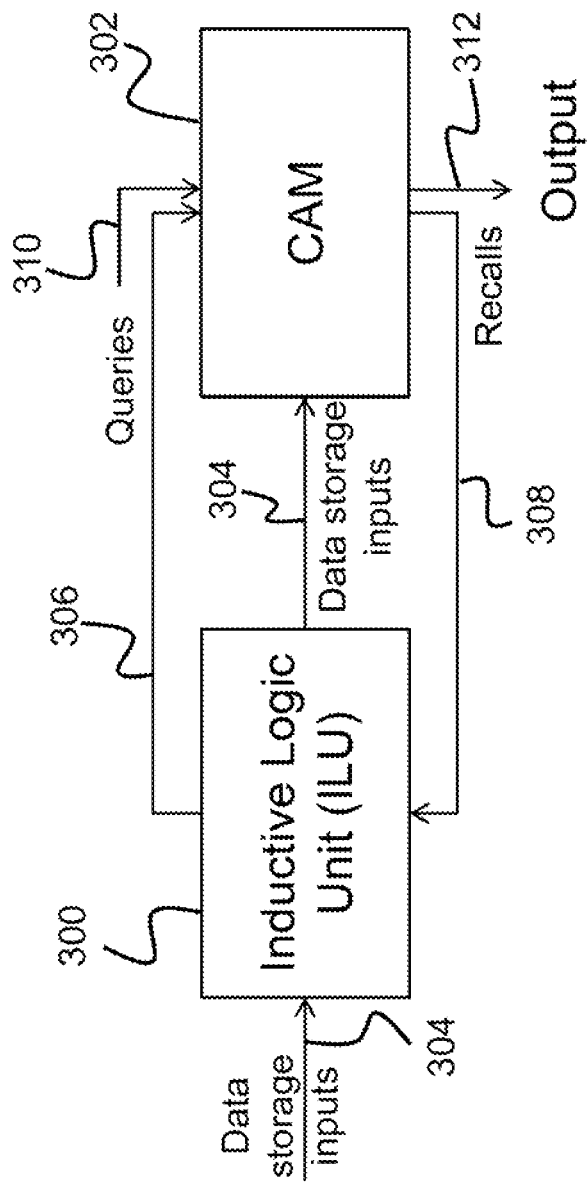
FIG. 3 is a flow diagram illustrating a system to discover and encode indirect associations in associative memory according to the principles of the present invention.

As illustrated in FIG. 3, some embodiments of the invention described herein is comprised of an Inductive Logic Unit (ILU) 300 that is interfaced to most any content-addressable memory (CAM) 302. A CAM is known in the art and described in the Pagiamtzis reference. In general, a CAM is designed to compare input search data (e.g., user-supplied data word) against, for instance, a table of stored data and returns the address of matching data (or the matching data itself). Thus, a CAM 302 is the hardware embodiment of what in software terms would be called an associative array. For the purposes of this invention, an interface is a shared boundary across which two separate components of a computer system exchange information. In some embodiments, an ILU is a physical computational device dictated by inductive logic.

The ILU 300 is inserted into an input stream 304 that first goes to the ILU 300 and then goes to the CAM 302. Therefore, all inputs to the CAM 302 go through the ILU 300 first; these inputs are expected to be associations between two data patterns (here called A and B) associated in the CAM 302. The ILU 300 makes queries 306 to the CAM 302 to find out if either A or B are stored as part of any existing association. The queries 304 are of the form A-?. If either A or B are known, then a new indirect association is made and stored. If neither A nor B has been encountered before, then there are no indirect associations to be made. Finally, if applicable, the new A-B association is stored.

Note that in FIG. 3, the ILU 300 only intercepts data storage inputs (in the input stream 304) and recalls 308 from the CAM 302. Queries 310 from the user are input directly into the CAM 302. A query 310 from the user is of the form X-?, where the user is asking if X is associated with anything currently in the CAM 302. X could be any object or item; some non-limiting examples might be a word or an image. Recalls 312 in response to a user's direct query 310 are output to the user and also copied to the ILU 300. A recall (element 308 or element 312) in response to a query (a ILU query 306 or a user query 310) is anything that is cued by the query, and might be a word, an image, or other representation. The ILU 300 can ignore recalls 308 because they can't result in new indirect associations.

Figure 5:
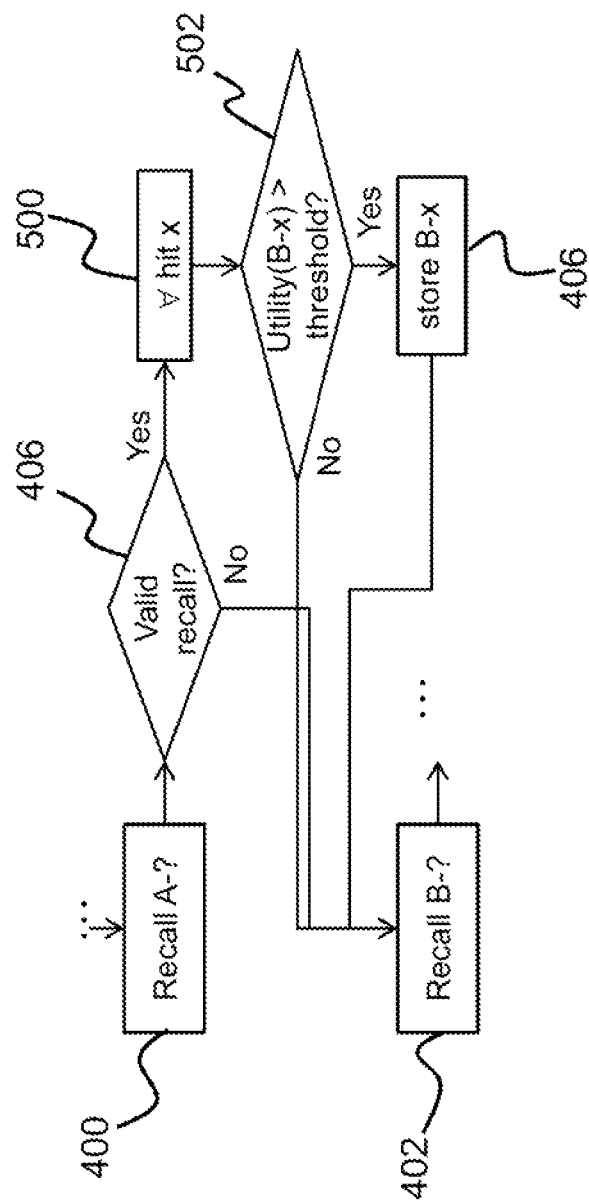
FIG. 5 is a flow diagram illustrating how storage of the indirect associations can be subjected to a threshold according to the principles of the present invention.

In an embodiment of the system according to the principles of the present invention, a computer program that implements the process illustrated in FIG. 3 can be run on the same computer the CAM 302 is run on, and intercepts the input data in the input stream 304 and controls the CAM 302 by making commands as shown in FIG. 3. It can optionally also impose a utility metric as shown in FIG. 5 and described below. Note that a process such as the one depicted in FIG. 3 translates directly into pseudocode, which may be implemented in most any computer language.

Figure 4:
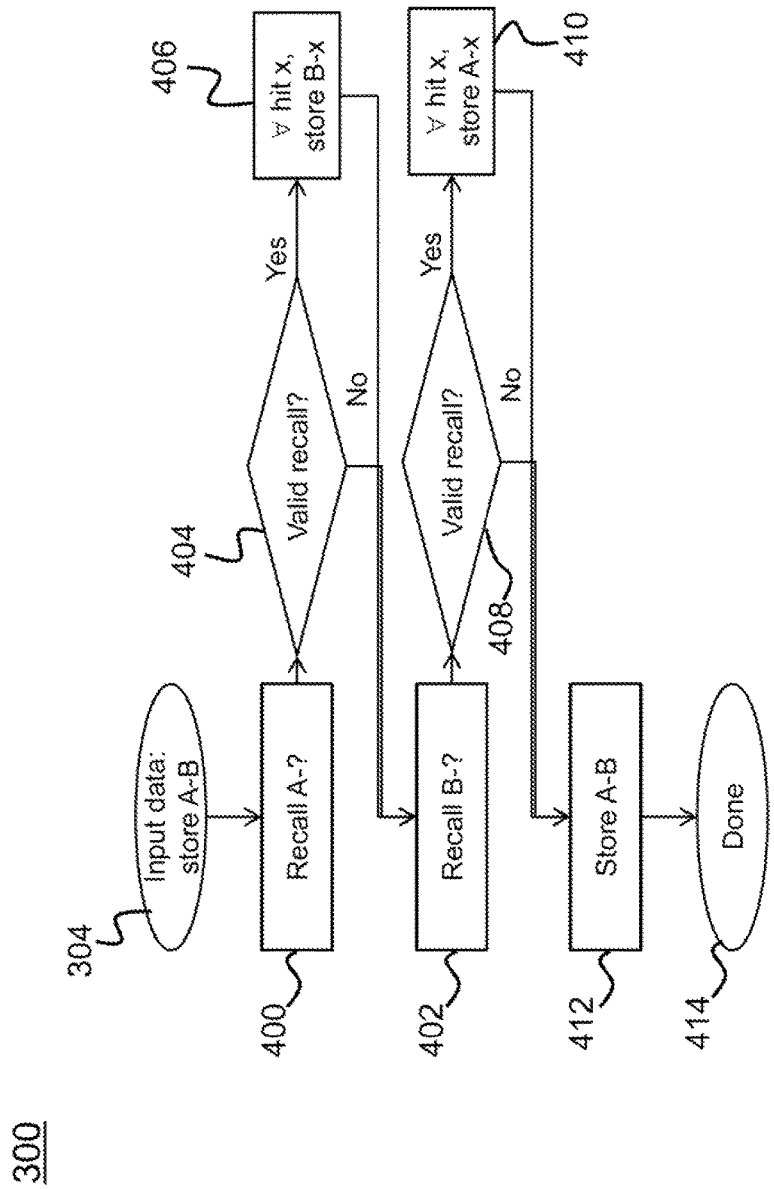
FIG. 4 is a flow diagram illustrating an implementation of an Inductive Logic Unit (ILU) without utility metrics according to the principles of the present invention.

The ILU 300 supplies new queries 306 and possibly stores new associations, as illustrated in a flow diagram of the ILU 300 logic in FIG. 4. A-B represents a new association to be stored, between two patterns, A and B, either of which may be novel or part of an association already stored in the CAM 302. The ILU 300 receives the input data stream 304 of an association between, for example, A and B. Each association is tested in turn (i.e., recall A-? 400, recall B-? 402) to find any previous association X for either A or B. FIG. 4 depicts this as "valid recall?" 404, which represents the way different types of systems can indicate that they have found a valid memory. Any memory system must be able to tell whether it contains a queried item, so whatever mechanism is used in the CAM, the system according to the principles of the present invention is also connected with. If a previous association A-X is found ("valid recall" 404 is true), then B-X is stored 406. Likewise, if a previous association B-X is found ("valid recall" 408 is true), then A-X is stored 410. Finally, A-B is stored 412, and the process is done 414.

In an embodiment of the present invention, if the CAM is a neural network, then the input data A-B is two patterns of neural activation that can be visualized as a binary array of 1's and 0's, where a 1 means that a neural unit in that location is actively spiking, and 0 means it is not. The ILU converts that into two different inputs: A-?, which means that the A pattern is the cue and the "?" is a blank array of all 0's, and a B-? that is similarly defined. The A-? is input into the CAM, cueing a recall if the CAM contains any association of the A pattern with any other pattern. The recall, for example A-C, would be deemed valid if the A pattern on the output is very similar to the A pattern on the input. "Very similar" here would be judged in terms of the particular CAM's capability and tuning, based on a threshold set by trials in which known patterns are stored and then recalled and their similarity assessed. If the A pattern is very similar, above the threshold, then A-C is assumed to be a valid recall.

FIG. 5 illustrates a variation of the aspect described above, wherein storage (i.e., store B-X 406) of the found indirect association ($\forall$ hit×500) can be made contingent on a utility metric passing a given threshold 502. This requires that a utility metric can be readily computed for each association. As a non-limiting example, the utility metric could provide mission relevance in a robotic system. Further, to continue the fruit example described above, the utility metric for an agricultural robot could be related to the robot's ability to manipulate it. Thus, associations between "orange" and other types of fruit would be inhibited, and instead fruit-pick, fruit-soft_grip might be found, so that "orange" would be associated with pick and soft_grip. FIG. 5 illustrates how this would work for the B-X indirect association storage. A similar change could be made for an A-x indirect storage. Note that elements 406 and 500 of FIG. 5 are collectively represented by element 406 in FIG. 4. As can be appreciated by one skilled in the art, "A", "B", "x", and "X", are all generic non-limiting examples used to identify distinct patterns and associations. Note that the threshold in FIG. 5 (element 502) is a different from the similarity threshold used for valid recall described for FIG. 4. The utility metric threshold 502 represents how useful the result is for the goal of the recall, and that utility is purely based on a user-definition, such as "Recall Pictures-of-cars-with-fins?" and the utility metric measures the fin height off the hood and only returns true if the fins reach at least 3" over the height of the hood.

In some embodiments, the system associates members of a class together such that future actions or data retrieval involving other members of the class are pre-stored without requiring consideration of the overall class. For example, a user may store information "orange is a fruit", with A being orange, and B being the class fruit. When the storage occurs, the system automatically searches for other data patterns belonging to the same class, and pre-stores associations between the newly stored member of the class and other previously stored members of the class. For the fruit example, these associative pairs may be orange-apple, orange-pear, orange-banana.

These associative pairs may, in turn, enable the system to retrieve information or make determinations based on the additional associations without explicit instructions to refer to the class. For example, in the above example, a user may store additional information about one fruit, such as using a particular tool to pick one type of fruit. For example, the user may store "use a picker for an apple." When the system is instructed to retrieve a different fruit, such as a banana, and if there is no user-stored instruction regarding which tool to use, then the system may search for a pre-stored association that did have a user-stored instruction regarding tool use. In this case, the system would find the banana-apple association, then it may search for a user-stored instruction, then find the user-stored instruction to use a picker. The system would then use that instruction to choose the tool for picking the banana without making an explicit search or query regarding classes of fruit.

In some embodiments, multiple levels of associations may be automatically pre-stored. For example, the class fruit may be a part of a category plants, which may be part of a larger category "living things," etc. In such cases, the system may automatically store pre-associations between a newly stored member of a class and/or members of the category and/or members of the larger category.

In some embodiments, the system may be used to process image information. For example, image information taken from a UAV (e.g., a drone), a plane, ground vehicle, or a stationary ground-based imaging system. The system or a user may identify an association between a part of the image and a particular class. For example, the user or the system may associate an image of one or more buildings with a particular function (e.g., manufacturing, storage, residences, hospitals, weapons assembly, etc.). The association may be made manually by a user and/or automatically based on characteristics of the one or more buildings (e.g., shape of the building, arrangements of buildings, objects near or in the building, or particular persons in or near the buildings). The processing performed by the system may occur on board a vehicle (e.g., the drone, plane, or ground vehicle) or it may be processed by one or more processors that are able to access data acquired using the vehicle.

The system may then automatically store an association between the part of the image and another data pattern stored as being part of the class. In other embodiments, the association may be formed between the part of the image and other data patterns that are part of a category that includes the class, or data patterns within the larger category that includes the category.

In some embodiments, in a later search involving the part of the image, the system may automatically return the data patterns that were automatically stored.

In some embodiments, the associations may be between varied kinds of data, such as image data, radar data, scents, or other patterns that were stored at the same time, or in the same region as the initial storage. These, in turn, may be associated with other varied kinds of data that were stored with other members of the same class, category, larger category, etc. In this way, associations may be formed between seemingly unconnected data for more rapid and potentially more useful retrieval. Based on the retrieved information, the system may make an automatic determination on how to perform a subsequent action, such as navigating in a particular direction, or acquiring additional information via sensors such as cameras, radar, etc.

In some embodiments, video from a UAV may be buffered on board the UAV prior to being downloaded by a remote system (e.g., a satellite, a remote ground-based server). In such cases, an operator may review the downloaded video, and may manually apply a label to a type of image (e.g., a configuration of buildings). The label may be propagated to the UAV, where the system may automatically apply the label as associations to other images that fall within the same class (e.g., the same or similar configuration of buildings). The system may then automatically raise the download priority for the images having the same label, causing them to be downloaded earlier than other images. In some embodiments, the system may also associate the label with one or more other additional characteristics or data groups that are related to the original image, such as by belonging to the same class, category, or larger category. These may include such characteristics as persons, objects, or nearby images that were recorded near the original image.

What is claimed is:

1. A system for detecting and encoding indirect associations in stimulus patterns, the system comprising:
   a content-addressable memory (CAM) configured to receive at least one data storage input comprising an association between a first data pattern and a second data pattern; and
   an inductive logic unit (ILU) interfaced with the CAM for identifying at least one indirect association related to the at least one data storage input.

2. A system for detecting and encoding indirect associations in stimulus patterns, the system comprising:
   one or more processors and a non-transitory computer-readable medium having executable instructions encoded thereon such that when executed, the one or more processors perform operations of:
   receiving at least one data storage input in a content-addressable memory (CAM), wherein the at least one data storage input comprises an association between a first data pattern A and a second data pattern B;
   identifying at least one indirect association related to the at least one data storage input with an inductive logic unit (ILU) interfaced with the CAM; and
   storing the at least one indirect association.

3. The system as set forth in claim 2, wherein the one or more processors further perform operations of:
   generating a query from the ILU to the CAM;
   determining whether either of the first data pattern A or the second data pattern B is stored as part of an existing association in the CAM; and
   if either the first data pattern A or the second data pattern B is a known data pattern, then storing a new indirect association for the known data pattern.

4. The system as set forth in claim 3, wherein a user inputs a direct query into the CAM to determine if a data pattern is stored as part of an existing association in the CAM, wherein if the data pattern is stored as part of an existing association in the CAM, then a recall in response to the user's direct query is output to the user and copied to the ILU.

5. The system as set forth in claim 4, wherein storage of the at least one indirect association is contingent on a utility metric passing a predetermined threshold.

6. The system as set forth in claim 5, wherein the one or more processors further perform operations of:
   querying an association between the first data pattern A and a previous association X;
   if a previous association A-X is found in the CAM, then storing an indirect association B-X;
   querying an association between the second data pattern B and the previous association X; and
   if a previous association B-X is found in the CAM, then storing an indirect association A-X.

7. A computer-implemented method for detecting and encoding indirect associations in stimulus patterns, comprising an act of causing a data processor to execute instructions stored on a non-transitory memory such that upon execution, the data processor performs operations of:
   receiving at least one data storage input in a content-addressable memory (CAM), wherein the at least one data storage input comprises an association between a first data pattern A and a second data pattern B;
   identifying at least one indirect association related to the at least one data storage input with an inductive logic unit (ILU) interfaced with the CAM; and
   storing the at least one indirect association.

8. The method as set forth in claim 7, wherein the one or more processors further perform operations of:
   generating a query from the ILU to the CAM;
   determining whether either of the first data pattern A or the second data pattern B is stored as part of an existing association in the CAM; and
   if either the first data pattern A or the second data pattern B is a known data pattern, then storing a new indirect association for the known data pattern.

9. The method as set forth in claim 8, wherein a user inputs a direct query into the CAM to determine if a data pattern is stored as part of an existing association in the CAM, wherein if the data pattern is stored as part of an existing association in the CAM, then a recall in response to the user's direct query is output to the user and copied to the ILU.

10. The method as set forth in claim 9, wherein storage of the at least one indirect association is contingent on a utility metric passing a predetermined threshold.

11. The method as set forth in claim 10, wherein the one or more processors further perform operations of:
  querying an association between the first data pattern A and a previous association X;
  if a previous association A-X is found in the CAM, then storing an indirect association B-X;
  querying an association between the second data pattern B and the previous association X; and
  if a previous association B-X is found in the CAM, then storing an indirect association A-X.

12. The computer program product for detecting and encoding indirect associations in stimulus patterns comprising computer-readable instructions stored on a non-transitory computer-readable medium that are executable by a computer having one or more processors for causing the one or more processors to perform operations of:
  receiving at least one data storage input in a content-addressable memory (CAM), wherein the at least one data storage input comprises an association between a first data pattern A and a second data pattern B;
  identifying at least one indirect association related to the at least one data storage input with an inductive logic unit (ILU) interfaced with the CAM; and
  storing the at least one indirect association.

13. The computer program product as set forth in claim 12, further comprising instructions for causing the one or more processors to perform operations of:
  generating a query from the ILU to the CAM;
  determining whether either of the first data pattern A or the second data pattern B is stored as part of an existing association in the CAM; and
  if either the first data pattern A or the second data pattern B is a known data pattern, then storing a new indirect association for the known data pattern.

14. The computer program product as set forth in claim 13, wherein a user inputs a direct query into the CAM to determine if a data pattern is stored as part of an existing association in the CAM, wherein if the data pattern is stored as part of an existing association in the CAM, then a recall in response to the user's direct query is output to the user and copied to the ILU.

15. The computer program product as set forth in claim 14, wherein storage of the at least one indirect association is contingent on a utility metric passing a predetermined threshold.

16. The computer program product as set forth in claim 15, further comprising instructions for causing the one or more processors to perform operations of:
  querying an association between the first data pattern A and a previous association X;
  if a previous association A-X is found in the CAM, then storing an indirect association B-X;
  querying an association between the second data pattern B and the previous association X; and
  if a previous association B-X is found in the CAM, then storing an indirect association A-X.

17. The computer program product as set forth in claim 12, wherein at least one of the first data pattern A and the second data pattern B is a member of a class that includes a third data pattern C, and the at least one indirect association is an association between the third data pattern C with at least one of the first data pattern A and the second data pattern B.

18. The computer program product as set forth in claim 12, wherein at least one of the first data pattern A and the second data pattern B includes image data acquired using an image sensor.

* * * * *